United States Patent [19]
Salimi et al.

[11] Patent Number: 5,883,818
[45] Date of Patent: Mar. 16, 1999

[54] METHOD FOR GENERATING AN IMPROVED MODEL FOR EVALUATING THE OPERATION OF AN INTEGRATED CIRCUIT DESIGN

[75] Inventors: Bijan Salimi, Colchester; David Bruce White, Essex Junction, both of Vt.

[73] Assignee: International Business Machines Corporation, Armonk, N.Y.

[21] Appl. No.: 705,580

[22] Filed: Aug. 29, 1996

[51] Int. Cl.⁶ .................................................. G06F 17/50
[52] U.S. Cl. .................. 364/578; 364/489; 364/490; 371/28
[58] Field of Search .................... 364/578, 488, 364/489, 490, 148, 149, 150, 152, 492; 395/500, 555, 551; 371/22.1, 28

[56] References Cited

U.S. PATENT DOCUMENTS

| | | | |
|---|---|---|---|
| 3,564,223 | 2/1971 | Harris et al. | 235/150.31 |
| 4,949,259 | 8/1990 | Hunt et al. | 364/413.25 |
| 5,047,969 | 9/1991 | Sloane | 364/578 |
| 5,092,780 | 3/1992 | Vlach | 434/433 |
| 5,128,607 | 7/1992 | Clark et al. | 324/78 D |
| 5,164,911 | 11/1992 | Juran et al. | 364/578 |
| 5,274,568 | 12/1993 | Blinne et al. | 364/489 |
| 5,345,579 | 9/1994 | Hynes | 395/500 |
| 5,359,535 | 10/1994 | Djaja et al. | 364/489 |
| 5,377,122 | 12/1994 | Werner et al. | 364/488 |
| 5,452,225 | 9/1995 | Hammer | 364/488 |
| 5,469,366 | 11/1995 | Yang et al. | 364/489 |
| 5,475,607 | 12/1995 | Apte et al. | 364/489 |
| 5,477,474 | 12/1995 | Southgate et al. | 364/578 |
| 5,535,145 | 7/1996 | Hathaway | 364/578 |
| 5,553,008 | 9/1996 | Huang et al. | 364/578 |
| 5,655,109 | 8/1997 | Hamid | 395/500 |
| 5,666,288 | 9/1997 | Jones et al. | 364/489 |

FOREIGN PATENT DOCUMENTS

| | | |
|---|---|---|
| 6-103332 | 4/1994 | Japan . |
| 6-223127 | 8/1994 | Japan . |
| 7-249060 | 9/1995 | Japan . |

OTHER PUBLICATIONS

"Circuit Structure for Measuring Delays of Logic Gates on VLSI Chips," *IBM Technical Disclosure Bulletin*, vol. 26, No. 7B, Dec. 1983, pp. 3672–3674.

"Allocating Maximum RC Delays to Guarantee Timing by Depth First Search," *IBM Technical Disclosure Bulletin*, vol. 38, No. 9B, Sep. 1993, pp. 301–303.

"Heirarchical Delay Predictor and Corrector," *IBM Technical Disclosure Bulletin*, vol. 33, No. 2, Jul. 1990, pp. 81–83.

*Primary Examiner*—Kevin J. Teska
*Assistant Examiner*—Thai Phan
*Attorney, Agent, or Firm*—McGinn & Gibb, P.C.; Richard M. Kotulak, Esq.

[57] ABSTRACT

Modeling of propagation delay and output transition time by use of fitting functions comprised of standard Taylor series and inverse powers is disclosed. These components are used as a basis for generating an equation that predicts circuit performance over a wide range of input transition and output capacitive loads. The present invention includes a computer implemented method for adding functions to the fitting functions or removing functions from the fitting functions until an acceptable error limit has been reached.

29 Claims, 3 Drawing Sheets

METHOD FOR GENERATING AN IMPROVED MODEL FOR EVALUATING THE OPERATION OF AN INTEGRATED CIRCUIT DESIGN

FIELD OF THE INVENTION

The present invention relates, in general, to the design of integrated circuits and, more particularly, to methods for generating models for evaluating the operation of an integrated circuit design.

BACKGROUND OF THE INVENTION

In integrated circuit design, circuits for commonly used functions, such as AND gates, OR gates, etc., are often combined into "cells," and a model is created for each cell. These models are used in circuit simulation to provide a simpler model of the cell than would be provided by simulating each of the components within a cell. Typically, the model is used to determine the delay of a signal through the cell, the transition time of the output signal, the input capacitance and power dissipation values for the cell.

IBM Corporation (IBM is a registered trademark of International Business Machines Corporation) has used an early timing estimator (ETE) equation for modeling the delay of a signal through a cell. This equation was optimized for multistate circuit designs over a limited operating range of input transition and output capacitive loads. For a detailed description of ETE see EDS manual 3325 "Early Timing Estimator (ETE) User's Guide and Reference." This equation has been outdated by advances in submicron silicon technologies and faster cycle times (greater than 150 megahertz). With the increased speed of submicron integrated circuits, the current ETE equation has led to unacceptable errors, e.g., errors that are often as large as the total delay between gates. What is needed is a method for generating an improved model for evaluating the operation of an integrated circuit design. It is an object of the present invention to improve the accuracy of the ETE equation by generating a high performance delay/transition equation which reduces the average propagation delay error and provides more consistent accuracy over a wider operating range.

SUMMARY OF THE INVENTION

It is one object of the present invention to generate a timing model for an integrated circuit.

It is another object of the present invention to generate a model which is more accurate than IBM Corporation's ETE model.

The above objects and other objects of the invention are accomplished by a process for generating a model for evaluating the operation of an integrated circuit design comprising a set of logic cells according to the invention. The process comprises the steps of 1) evaluating the performance of at least a portion of one of the logic cells at different operating parameters to generate simulation data; 2) generating a model comprising at least a first modeling function; 3) exercising the model to generate modeling data; 4) comparing the modeling data to the simulation data to determine an error profile therebetween; 5) determining whether the error profile is within an acceptable limit; 6) choosing a second modeling function to be added to the model which reduces the error profile toward the acceptable limit; and 7) repeating steps 3)–6) until the error profile is within the acceptable limit.

The present invention also includes a computer implemented method which implements the method steps set forth above.

The present invention also includes a method of designing an integrated circuit. The method comprises the steps of selecting and combining a set of logic cells utilizing characterization data for at least a portion of one of the logic cells. The characterization data is generated by 1) evaluating the performance of the portion of the logic cell at different operating parameters to generate simulation data; 2) generating a model comprising at least a first modeling function; 3) exercising the model to generate modeling data; 4) comparing the modeling data to said simulation data to determine an error profile therebetween; 5) determining whether the error profile is within an acceptable limit; 6) if the error profile is not within an acceptable limit, then performing the following steps: a) adding a next modeling function to the model; b) determining whether the error profile was improved by the addition of the next modeling function; c) if the error profile was not improved by the addition of the next modeling function, removing the last modeling function added to the model from the model.

Steps 3)–6) are repeated until the error profile is within the acceptable limit. Finally, the method of the present invention includes the step of using the model to design the integrated circuit.

The present invention provides the advantage of improved accuracy as compared to the prior art ETE equation.

The present invention provides the advantage of more accurate timing/slack analysis to leverage critical path performance in submicron integrated circuit technologies.

Another advantage of the present invention is better assessment/interpretation of "critical net" timing results to prioritize manual intervention during the physical design process of an integrated circuit, hence reducing unnecessary workload.

Another advantage of the present invention is reduced need to perform lengthy circuit simulation on critical paths.

Another advantage of the present invention is more accurate chip floor planning.

DETAILED DESCRIPTION OF A PREFERRED EMBODIMENT OF THE INVENTION

Figure 1:
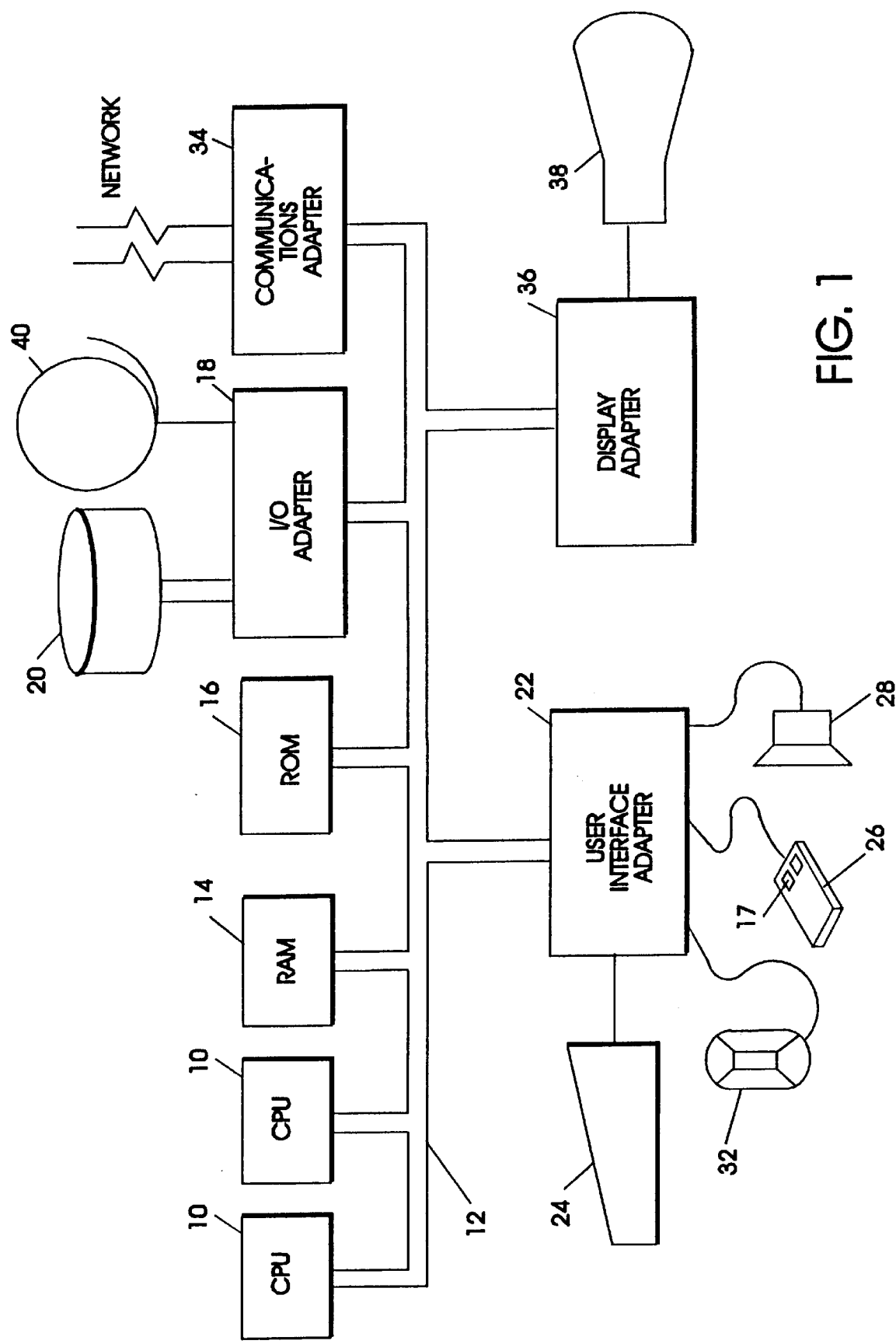
FIG. 1 is an information handling/computer system embodying the present invention.

A representative hardware environment for practicing the present invention is depicted in FIG. 1, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 20 and tape drives 40, to bus 12, user interface adapter 22 for connecting keyboard 24, mouse 26, speaker 28, microphone 32, and/or other user interface devices such as touch screen device (not shown) to bus 12, communication adapter 34 for connecting the information handling system to a data processing network, and display adapter 36 for connecting bus 12 to display device 38.

Figure 2:
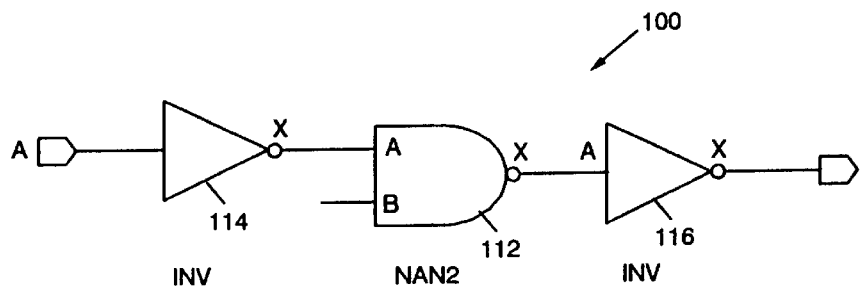
FIG. 2 schematically depicts a representative set of cells to which the present invention applies.

FIG. 2 schematically depicts a set of logic cells 100, including exemplary logic cell 112, for which it is desired to accurately model the actual delay time, transition time, power dissipation, and input capacitance for an execution signal along a given path through the cell from input to output. The delay and transition times, power dissipation, and input capacitance for individual cells are used by designers to predict the overall delay time for the associated cells and thereby determine whether or not the delay time is within specifications or otherwise suitable for a given circuit. Delay time and transition time modeling is useful, in general, in designing all types of integrated circuits and, in particular, in designing ASICs (Application Specific Integrated Circuits) using cell libraries.

Still referring to FIG. 2, the illustrated current logic cell 112 is a NAND cell comprising a pair of input pins A, B and an output pin X. A driving cell 114 is connected to the input side of cell 112, and a driven cell 116 is connected to the output side. Both the driving cell 114 and the driven cell 116 are inverters which have input pin A and output pin X. Cells 100 and the particular type of cell 112 are given by way of example only and are in no sense limiting; rather, the present methodology is designed to provide accurate delay time, transition time, power dissipation, and input capacitance simulations for any type of logic cell or set of logic cells.

Figure 3:
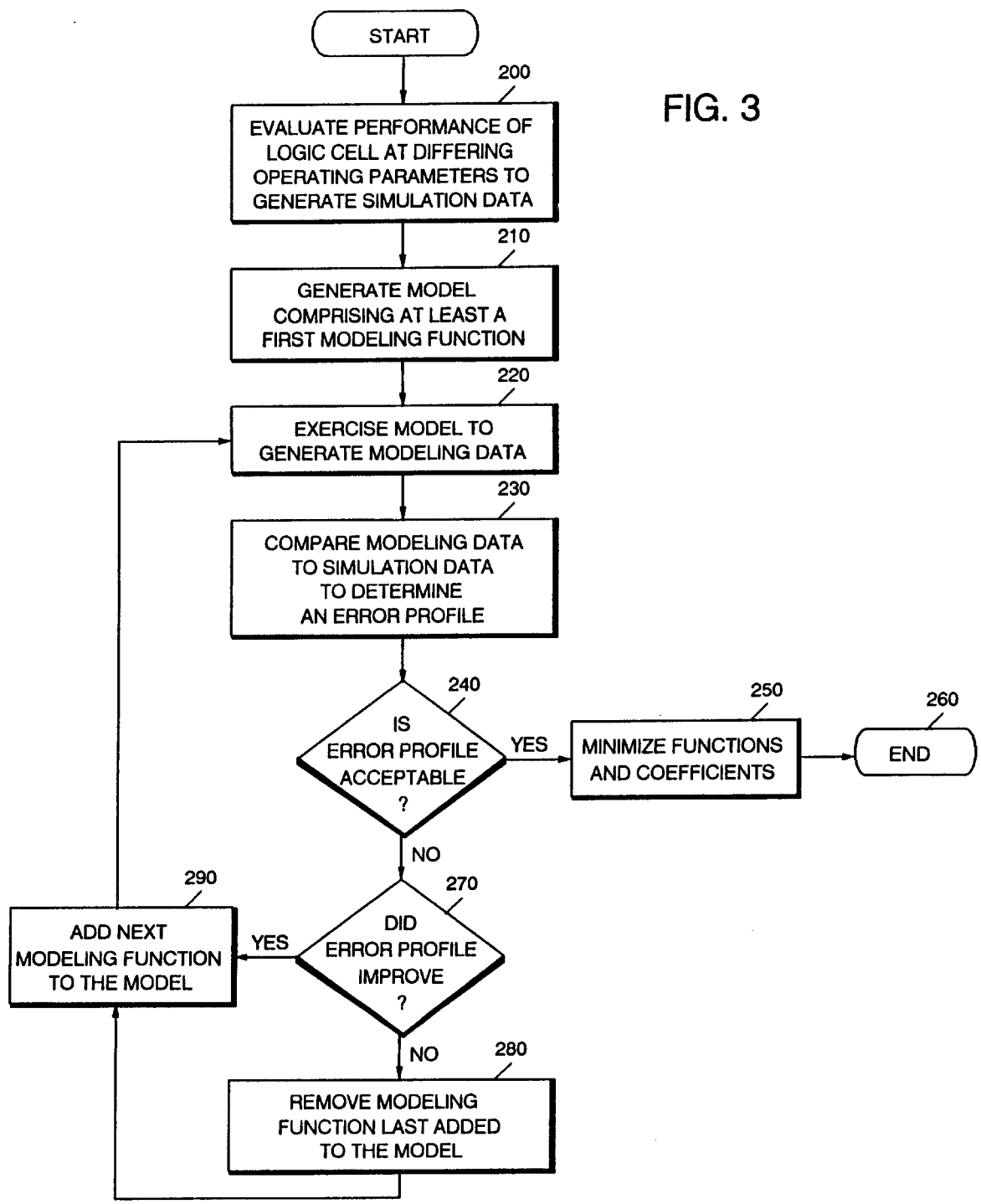
FIG. 3 is a flow chart illustrating method steps in accordance with the present invention.

In one aspect, the invention is embodied in a process for designing or designing and fabricating integrated circuits. A set of logic cells utilizing characterization data for at least a portion of one of the logic cells is selected and combined. Preferably, the characterization data is at least the delay time and transition time. The characterization data is generated by the following described steps which are illustrated in FIG. 3.

In a first step 200, the performance of the portion of the logic cell at different operating parameters is evaluated to generate simulation data. In the preferred embodiment, the logic cell is evaluated at more than 150 operating points to cover permutations of load capacitance, input transition, power supply bias, temperature and process effects. A model comprising at least a first modeling function is then generated in a second step 210. In a third step 220, the model is exercised to generate modeling data. In a fourth step 230, the modeling data is compared to the simulation data to determine an error profile therebetween. Next, it is determined whether the error profile is within an acceptable predetermined error limit in step 240. If the error profile is within the predetermined acceptable limit, then the process proceeds to step 250 where the functions and the corresponding coefficients of the functions in the model are minimized. The process then proceeds to and ends at step 260 where a model for generating characterization data for an integrated circuit design having an error profile within a predetermined acceptable limit remains ready for use by a designer for evaluating the operation of an integrated circuit design. If the error profile is not within an acceptable limit, then, in the first iteration of the process, a second modeling function is added to the model and a determination is made whether the error profile was improved by the addition of the second modeling function in step 270. This determination is made by re-exercising the model with the newly added second function to generate a new set of modeling data in step 220 and then comparing the new set of modeling data to the simulation data to determine a new error profile in step 230. At this point a determination is again made in set 240 whether the new error profile is within the predetermined acceptable limit and, if so, the process proceeds to step 250. Otherwise, the process proceeds to step 270 wherein this new error profile is then compared to the previous error profile to determine whether the error profile was improved by the addition of the second modeling function. If the error profile was not improved by the addition of the second modeling function, then the second modeling function is removed from the model in step 280 and the process proceeds to step 290. In step 290, the next modeling function is added to the model. Even if the error profile was improved as determined in step 270, the process still proceeds to step 290. After adding the next function in step 290, the process returns to step 220. Thus steps 220, 230, 240, 270 and 290 are repeated for each new function added to the model until an acceptable error profile is achieved as determined by step 240. Finally, the model is used to design the integrated circuit. For an example of using a cell library and timing models to design an integrated circuit, see U.S. Pat. No. 5,274,568, which is hereby incorporated by reference.

In the preferred embodiment, the model generated is a mathematical equation having the following form:

$$((K_1 * Tx^2 + K_2 * Tx + K_3 + K_4/(Tx + \text{MinRise})) * Cl^2 +$$

$$(K_5 * Tx^2 + K_6 * Tx + K_7 + K_8/(Tx + \text{MinRise})) * Cl +$$

$$(K_9 * Tx^2 + K_{10} * Tx + K_{11} + K_{12}/(Tx + \text{MinRise})) +$$

$$(K_{13} * Tx^2 + K_{14} * Tx + K_{15} + K_{16}/(Tx + \text{MinRise})) *$$

$$(1/(Cl + \text{MinCap}))) * (1 + K_{17} * (V_{dd} - V_{base})) *$$

$$(1 + K_{18} * (T - T_{base}))$$

wherein $K_1$–$K_{18}$ are coefficients outputted by the coefficient optimizer 370; Tx is the input transition time of a signal passing through the cell; MinRise is the minimum or fastest rise time of the signal; Cl is the capacitive load connected to the output of the cell; MinCap is the minimum capacitive load connected to the input of the cell; $V_{dd}$ is voltage across the cell; $V_{base}$ is the base voltage at which the cell was characterized; T is the temperature of the cell; and $T_{base}$ is the base temperature at which the cell was characterized. This equation may be used to determine the delay of a signal through the cell, the transition time of the output signal, or the input capacitance and power dissipation values for the cell.

Steps 210 and 240 further comprise the steps of subtracting the simulation data from the modeling data to produce a resultant, dividing the resultant by the simulation data to produce a percentage error and, using the percentage error to generate coefficients for the model. Step 200 further includes the step of determining the load capacitance and input transition at the different operating parameters. Steps 210 and 290 further include the step of basing the first and next modeling functions on standard Taylor series and inverse powers of load capacitance and input transition. The method of the present invention further includes the step of selecting the modeling functions used in the model from a set of heuristic rules. The set of heuristic rules comprises a library of curve/surface fitting functions for approximating various shaped curves/surfaces. The shape of the error profile is matched with one or more of these fitting functions. For example, if the error profile has a shape of a sine wave, then the sine function is selected from the set of heuristic rules as one of the modeling functions used to generate the model.

Figure 4:
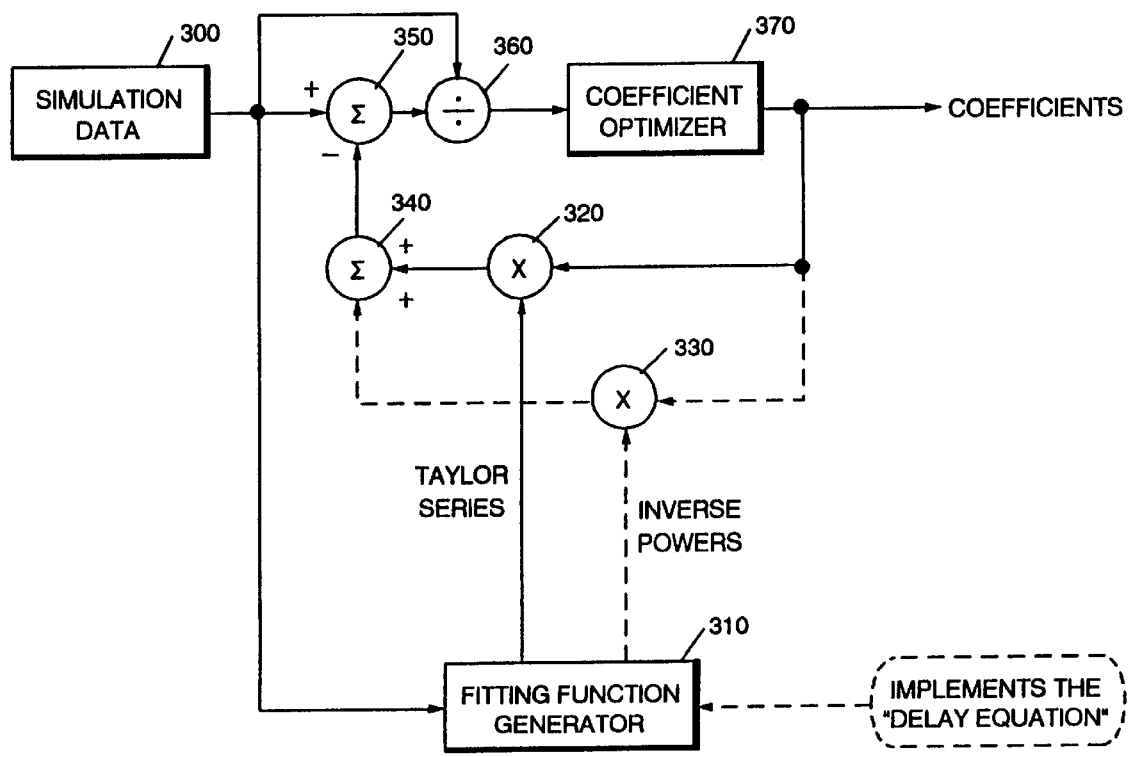
FIG. 4 is a schematic diagram illustrating, in further detail, a process for generating a model in accordance with the present invention.

FIG. 4 is a schematic diagram illustrating, in further detail, a process for generating a model in accordance with the present invention. Simulation data 300 is processed to extract performance information, such as delay of signal through the cell, the transition time of the output signal, power dissipation, etc., and operating parameters. The operating parameters from simulation data 300 are passed to the currently selected set of modeling functions 310, to compute their contributions for each evaluation point in the input set. Each contribution is multiplied, in multipliers 320, 330, by the current corresponding coefficient, then summed by adder 340 and subtracted from the corresponding performance information by adder 350. This resultant is then divided by the simulation data to provide a percent error by divider 360. The percent error is then inputted into a coefficient optimizer 370 which uses steepest descent and Levenberg-Marquardt techniques to optimize the coefficients and minimize this fitting error over all of the evaluation points in the input set. Using the percent error as input to coefficient optimizer 370 provides improved fitting for the high performance signals. This in turn leads to the need for the inverse powers in the modeling functions. It will be appreciated that, although not shown in FIG. 4, fitting can still be achieved by feeding the resultant outputted from adder 350, rather than the percent error, directly into coefficient optimizer 370. However, the fitting errors on the quicker signals will tend to increase. The resultant, in this case, is the absolute error and is used to perform absolute fitting as opposed to percentage fitting, which uses the percent error. Absolute fitting distributes errors across all the fitted points until a minimum total error is reached, whereas percentage fitting minimizes the total percentage error of all the fitted points, and thus provides a more accurate fit as delay times decrease. It is to be noted that the inverse powers in the modeling functions is not required if the resultant is fed directly into the coefficient optimizer 370 instead of the percent error.

The currently selected set of modeling functions 310, together with the optimized coefficients outputted from coefficient optimizer 370, are used as the model that is exercised in step 220 of FIG. 3, to generate the modeling data compared in step 230.

The preceding method is preferably implemented by a computer system such as illustrated in FIG. 1, from a program storage device readable by the computer system. The program storage device could be RAM 14, ROM 16, disk units 20, tape drives 40, floppy disks, hard disks, compact discs or the like.

It will be appreciated that each new modeling function added to the model could be prescreened to determine whether that function will improve or reduce the error profile. In this manner, only those functions which reduce the error profile would actually be added to the model.

Although the present invention and its advantages have been described in detail, it should be understood that various changes, substitutions and alterations can be made herein without departing from the spirit or scope of the invention as defined in the appended claims.

What is claimed is:

1. A method of designing an integrated circuit, said method comprising the steps of selecting and combining a set of logic cells utilizing models for one or more portions of the logic cells, a model of at least one portion of said portions being generated by:

1) evaluating the performance of the portion of the logic cell at different operating parameters to generate simulation data;
2) generating said model for said portion utilizing a modeling function;
3) exercising the model to generate modeling data for said portion;
4) comparing the modeling data to said simulation data to determine an error profile therebetween for said model;
5) determining whether the error profile is within an acceptable limit;
6) if the error profile is not within an acceptable limit, then performing the following steps:
   a) adding an additional modeling function to the model based on said error profile;
   b) determining whether the error profile was improved by the addition of the additional modeling function;
   c) if the error profile was not improved by the addition of the additional modeling function, removing the additional modeling function from the model;
7) repeating steps 3)–6) until the error profile is within the acceptable limit.

2. The method as recited in claim 1, wherein steps 2) and 6)a) further comprise the steps of:
   a) subtracting the simulation data from the modeling data to produce a resultant;
   b) dividing said resultant by the simulation data to produce a percentage error; and
   c) using the percentage error to generate coefficients for the model.

3. The method as recited in claims 1 or 2, wherein the step of generating said model and the step of choosing an additional modeling function includes the step of basing the first and additional modeling functions on standard Taylor series and inverse powers of load capacitance and input transition.

4. The method as recited in claim 1, wherein the step of evaluating the performance includes the step of determining the load capacitance and input transition at the different operating parameters.

5. The method as recited in claim 1, further including the step of minimizing coefficients of each of the modeling functions after the error profile is within the acceptable limit.

6. The method as recited in claim 5, wherein the steps of generating said model and adding an additional modeling function include the step of using steepest descent and Levenberg-Marquardt techniques to optimize the coefficients.

7. The method as recited in claim 1, further comprising the step of selecting the modeling functions to be included in the model from a set of heuristic rules.

8. The method as recited in claim 1, wherein steps 2) and 6)a) further comprise the steps of:
   a) subtracting the simulation data from the modeling data to produce a resultant; and
   b) using the resultant to generate coefficients for the model.

9. The method as recited in claims 1 or 8, wherein the step of generating said model and the step of choosing an additional modeling function includes the step of basing the first and additional modeling functions on standard Taylor series.

10. A method for evaluating the operation of an integrated circuit design comprising a set of logic cells, said method comprising the steps of:

1) evaluating the performance of at least a portion of one of the logic cells at different operating parameters to generate simulation data;
2) generating a model for said portion utilizing a modeling function;
3) exercising the model to generate modeling data for said portion;

4) comparing the modeling data to the simulation data to determine an error profile for said model;

5) determining whether the error profile is within an acceptable limit;

6) adding a next modeling function to the model which reduces the error profile toward the acceptable limit, based on said error profile; and 7) repeating steps 3)–6) until the error profile is within the acceptable limit.

11. The method as recited in claim 10, wherein steps 2) and 6) further comprise the steps of:

a) subtracting the simulation data from the modeling data to produce a resultant;

b) dividing the resultant by the simulation data to produce a percentage error; and c) using the percentage error to generate coefficients for the model.

12. The method as recited in claims 10 or 11, wherein the step of generating a model and the step of choosing a next modeling function includes the step of basing the first and second modeling functions on standard Taylor series and inverse powers of load capacitance and input transition.

13. The method as recited in claim 10, wherein the step of evaluating the performance includes the step of determining the load capacitance and input transition at the different operating parameters.

14. The method as recited in claim 10, further including the step of minimizing the coefficients of each of the modeling functions after the error profile is within the acceptable limit.

15. The method as recited in claim 14, wherein the step of minimizing includes the step of using steepest descent and Levenberg-Marquardt techniques to optimize the coefficients.

16. The method as recited in claim 10, further comprising the step of selecting the modeling functions to be included in the model from a set of heuristic rules.

17. The method as recited in claim 10, wherein steps 2) and 6) further comprise the steps of:

a) subtracting the simulation data from the modeling data to produce a resultant; and b) using the resultant to generate coefficients for the model.

18. The method as recited in claims 10 or 17, wherein the step of generating a model and the step of choosing a next modeling function includes the step of basing the first and next modeling functions on standard Taylor series.

19. The method as recited in claim 10, wherein the step of choosing a next modeling function further comprises performing the following steps if the error profile is not within the acceptable limit:

a) determining whether the error profile was improved by the addition of the next modeling function; and b) if the error profile was not improved by the addition of the next modeling function, removing the next modeling function from the model.

20. A computer program product comprising:

a program storage device readable by a computer system tangibly embodying a program of instructions executable by said computer system to perform a process for evaluating the operation of an integrated circuit design comprising a set of logic cells, said process comprising the steps of:

1) evaluating the performance of at least a portion of one of the logic cells at different operating parameters to generate simulation data;

2) generating a model for said portion utilizing a modeling function;

3) exercising the model to generate modeling data for said portion;

4) comparing the modeling data to the simulation data to determine an error profile for said model;

5) determining whether the error profile is within an acceptable limit;

6) adding a next modeling function to the model which reduces the error profile toward the acceptable limit, based on said error profile; and 7) repeating steps 3)–6) until the error profile is within the acceptable limit.

21. The computer program product as recited in claim 16, wherein steps 2) and 6) of said process further comprises the steps of:

a) subtracting the simulation data from the modeling data to produce a resultant;

b) dividing the resultant by the simulation data to produce a percentage error; and c) using the percentage error to generate coefficients for the model.

22. The computer program product as recited in claims 20 or 21, wherein the step of generating a model and the step of choosing a next modeling function include the step of basing the first and second modeling functions on standard Taylor series and inverse powers of load capacitance and input transition.

23. The computer program product as recited in claim 20, wherein the step of evaluating the performance includes the step of determining the load capacitance and input transition at the different operating parameters.

24. The computer program product as recited in claim 20, wherein said process further includes the step of minimizing the coefficients of each of the modeling functions after the error profile is within the acceptable limit.

25. The computer program product as recited in claim 24, wherein the step of minimizing includes the step of using steepest descent and Levenberg-Marquardt techniques to optimize the coefficients.

26. The computer program product as recited in claim 20, wherein the process further comprises the step of selecting the modeling functions to be included in the model from a set of heuristic rules.

27. The computer program product as recited in claim 20, wherein the step of choosing a second modeling function further comprises performing the following steps if the error profile is not within the acceptable limit:

a) determining whether the error profile was improved by the addition of the next modeling function; and b) if the error profile was not improved by the addition of the next modeling function, removing the second modeling function from the model.

28. The computer program product as recited in claim 20, wherein steps 2) and 6) of said process further comprises the steps of:

a) subtracting the simulation data from the modeling data to produce a resultant; and b) using the resultant to generate coefficients for the model.

29. The computer program product as recited in claims 20 or 28, wherein the step of generating a model and the step of choosing a next modeling function includes the step of basing the first and next modeling functions on standard Taylor series.

* * * * *